United States Patent [19]

Dhong et al.

[11] Patent Number: 5,289,432

[45] Date of Patent: Feb. 22, 1994

[54] DUAL-PORT STATIC RANDOM ACCESS MEMORY CELL

[75] Inventors: Sang H. Dhong; Hyun J. Shin, both of Mahopac, N.Y.

[73] Assignee: International Business Machines Corporation, Armonk, N.Y.

[21] Appl. No.: 690,739

[22] Filed: Apr. 24, 1991

[51] Int. Cl.$^5$ .............................................. G11C 8/00
[52] U.S. Cl. ........................ 365/230.05; 365/189.09; 365/189.11; 365/228
[58] Field of Search ..................... 365/189.06, 189.09, 365/189.11, 228, 230.05

[56] References Cited

U.S. PATENT DOCUMENTS

| 4,298,961 | 11/1981 | Holta et al. ............... 365/189.06 X |
| 4,310,900 | 1/1982 | Tsujide .......................... 365/190 |
| 4,541,076 | 9/1985 | Bowers et al. ..................... 365/190 |
| 4,580,245 | 4/1986 | Ziegler et al. .................... 365/154 |
| 4,586,168 | 4/1986 | Adlhoch et al. ............... 365/156 X |
| 4,618,945 | 10/1986 | Sakurai et al. ................. 365/190 X |
| 4,660,177 | 4/1987 | O'Connor ..................... 365/154 X |
| 4,882,708 | 11/1989 | Hayakawa et al. ........... 365/189.04 |
| 4,901,284 | 2/1990 | Ochil et al. ........................ 365/226 |
| 5,016,214 | 5/1991 | Laymoun ...................... 365/189.06 |
| 5,103,423 | 4/1992 | Miyazaki et al. ............. 365/189.11 |

FOREIGN PATENT DOCUMENTS 3307756 9/1983 Fed. Rep. of Germany ...................... 365/189.06

OTHER PUBLICATIONS

Kevin J. O'Connor, The Twin-Port Memory Cell, IEEE Journal of Solid-State Circuits, vol. SC-22, No. 5 Oct. 1987, pp. 712–720.

Primary Examiner—Robert J. Pascal
Assistant Examiner—Benny Lee
Attorney, Agent, or Firm—Perman & Green

[57] ABSTRACT

A dual port SRAM is shown which comprises first and second word lines and first and second bit lines. A pair of semiconductor memory devices are cross coupled into a bistable circuit for storing true and complement logic levels and are coupled between common and power supply lines. A first access semiconductor is connected between the first bit line and one semiconductor memory device, and its control electrode is connected to the first word line. A second access semiconductor is connected between the second bit line and another of the semiconductor memory devices, and its control electrode is connected to the second word line. A write circuit is provided for applying write potentials to the first bit and word lines to switch the conduction states of the semiconductor memory devices. A further circuit is provided for reducing the voltage level on the power supply line when the write circuit applies the write potentials, the voltage reduction not being greater than 50% of its prereduction level, so that the potential at the second access semiconductor still exhibits a proper logic level in accordance with the memory state of the cell.

6 Claims, 3 Drawing Sheets

DUAL-PORT STATIC RANDOM ACCESS MEMORY CELL

FIELD OF THE INVENTION

This invention relates to a static random access memory (SRAM) cell, and more particularly to a CMOS SRAM cell which can be independently and asynchronously accessed from at least two separate ports.

BACKGROUND OF THE INVENTION

Conventional SRAM systems store binary information in cells comprising a pair of cross coupled inverters. Typically, these systems are "single port" and provide one path for reading information from the cell and for writing information into the cell. Multiport SRAMs are also available which allow completely independent and asynchronous access to each memory cell from a pair of ports (i.e., a dual-port memory). In FIG. 1, a block diagram is shown of a dual port SRAM 10 which has independent read/write circuits 12 and 14. Read/write circuit 12 has access to SRAM 10 through port A whereas read/write circuit 14 has access through port B. Both read/write circuits operate independently and asynchronously and can either write or read into any cell within SRAM 10. Microprocessors 16 and 18 access SRAM 10 through read/write circuits 12 and 14 respectively.

In FIG. 2, a conventional CMOS dual port SRAM cell is shown which consists of 4 memory transistors 20, 22, 24 and 26 and 4 access transistors 28, 30, 32 and 34. Most of the transistors in the circuit of FIG. 2 are n-channel MOS devices, except for transistors 20 and 22 which are p-channel MOS devices. "A port" bit lines 36 and 38 (BL-AT.BL-AC) provide true and complement access to and from the memory cell. Bit lines 40 and 42 (BL-BT, BL-BC)provide true and complement access to the cell port B. Word lines 44 and 46 (WL-A, WL-B) provide word line access from ports A and B respectively. $V_{DD}$ and GND designate supply and common potentials.

The conventional technique for reading or writing in the cell of FIG. 2 involves the differential sensing of complementary voltages on the pair of bit lines or the driving of the bit lines with complementary data. Thus, when a high state is applied to a word line (e.g., word line 44), access transistors 28 and 32 are rendered conductive. If bit lines 36 and 38 are then driven in a complementary fashion, the memory cell is forced to the state represented on bit lines 36 and 38, notwithstanding its prior memory state. Such a driving method is proven and well accepted, however, the differential driving and sensing techniques require an extra pair of bit lines as well as an extra pair of access transistors, all of which use up valuable semiconductor real estate.

In FIG. 3, a circuit is shown which employs single-ended bit-line writing/reading. Common components and levels to those shown in FIG. 2 are designated by identical numbers or letters. While the cell structure is simplified from that of FIG. 2, it presents operational problems when an attempt is made to switch the cell from the zero state to the one state. Assume that node X is at approximately ground potential due to the conduction of n-channel transistor 24 and the nonconduction of p-channel transistor 20. The low (ground) level at node X causes n-channel transistor 26 to be nonconductive and p-channel transistor 22 to be conductive. As a result, node Y is high (e.g. VDD).

If it is desired to drive node X to the one or high state, the potential on word line 44 is raised and causes access transistor 28 to become conductive. Bit line 36 is likewise raised to the high state (VDD). It is, however, difficult to raise the potential at node X to flip the cell. This is because the concurrent conduction of transistors 28 and 24 results in a voltage divider arrangement, and causes the voltage at node X to be at a potential between VDD and ground. Thus, while the node X potential rises as a result of the conduction of access transistor 28, it does not go sufficiently high to assure that the gate of transistor 26 is driven far enough positive to cause transistor 26 to go into heavy conduction. As a result, the cell may not flip under such conditions.

Similarly, to write a zero at node X (assuming it is already at the one or high state), word line 44 is driven high to VDD and bit line 36 is driven low to ground. It is however, difficult to lower the voltage at node X below a threshold logic level.

This is because when the left side of the cell exhibits the one state, transistor 24 is nonconductive and transistor 20 is conductive. Thus, notwithstanding the fact that bit line 36 drops to the low level, the potential at node X drops to a level determined by the voltage divider comprising transistors 20 and 28. The level at node X may therefore not drop below a logic threshold level that is required to assure the flipping of the cell.

It has been proposed that the operation of the cell in FIG. 3 could be improved by raising the word line "high" above VDD, using dynamic voltage boosting techniques. This solution is neither desirable nor practical because increased voltages across MOSFET's can degrade device reliability.

Other SRAM circuits and methods of operation can be found in the following prior art. In U.S. Pat. No. 4,660,177, to O'Connor, entitled "Dual Port Complementary Memory", a dual port memory cell is described which employs p and n access transistors to achieve cell simplification. That cell is also described in an article entitled "The Twin-Port Memory Cell", O'Connor, *IEEE Journal of Solid States Circuits*, Volume SC-22, No. 5, October 1987 pages 712-720. In addition, the O'Connor article considers a number of prior art SRAM circuits, including the circuit shown in FIG. 3 of this application.

U.S. Pat. No. 4,586,168 to Adlhoch et al., entitled "Dual Port Memory Sense Amplifier Isolation" describes a sense amplifier for a dual-port memory. The column select signal is deactivated as soon as the sense amplifier is set and read, enabling a faster write to the accessed cell. U.S. Pat. No. 4,541,076 to Bowers et al., entitled "Dual Port Random Access Memory", describes a system with CMOS dual-port memory operation. U.S. Pat. No. 4,580,245 to Ziegler et al., entitled "Complementary Metal Oxide Semiconductor Dual Port Random Access Memory Cell" describes a CMOS dual-port cell employing six transistors.

U.S. Pat. No. 4,618,945,to Sakurai et al., entitled "Semiconductor Memory Device" describes a memory system with master and local word lines. It also describes the concept of segmented word lines. U.S. Pat. No. 4,882,708 to Hayakawa et al., entitled "Semiconductor Memory Device", describes a memory with a "clear" mode wherein all of the word lines are selected simultaneously, resulting in a faster writing of identical data to all cells in the memory. U.S. Pat. No. 4,901,284 to Ochii et al., entitled "Static Random Access Memory" describes a SRAM cell with polysilicon loads and with means for detecting leaky cells.

U.S. Pat. No. 4,310,900 to Tsujide, entitled "Memory Device With Different Read and Write Power Levels" illustrates a prior art attempt at solving the problem above-described with respect to the circuit of FIG. 3. In specific, Tsujide describes a single-port memory cell with different read and write power levels. A single-port cell with four storage transistors and one access transistor is described wherein the write power supply level is lowered from the read power supply level. This action enables the voltage applied to the gate of the n-channel memory transistor that is conductive (storing a "O") to be lowered during the write cycle. As a result, the n-channel transistor is rendered marginally conductive, thereby enabling the potential at the input node (e.g. node X) to rise higher. However, because the circuit shown by Tsujide is a single port device, no consideration is given to the logic state on the complement side of the cell.

Accordingly, it is an object of this invention to provide an improved SRAM dual port memory cell having a small device count and occupying minimum silicon real estate.

It is another object of this invention to provide a six transistor, dual port SRAM cell wherein asynchronous access to and from both ports can occur.

It is another object of this invention to provide a six transistor, dual port SRAM cell wherein the transistors are not stressed through the use of over potentials.

SUMMARY OF THE INVENTION

A dual port SRAM is shown which comprises first and second word lines and first and second bit lines. A pair of semiconductor memory devices are cross coupled into a bistable circuit for storing true and complement logic levels and are coupled between common and power supply lines. A first access semiconductor is connected between the first bit line and one semiconductor memory device, and its control electrode is connected to the first word line. A second access semiconductor is connected between the second bit line and another of the semiconductor memory devices, and its control electrode is connected to the second word line. A write circuit is provided for applying write potentials to the first bit and word lines to switch the conduction states of the semiconductor memory devices. A further circuit is provided for reducing the voltage level on the power supply line when the write circuit applies the write potentials, the voltage reduction not being greater than 50% of its prereduction level, so that the potential at the second access semiconductor still exhibits a proper logic level in accordance with the memory state of the cell.

DETAILED DESCRIPTION OF THE INVENTION

Figure 3:
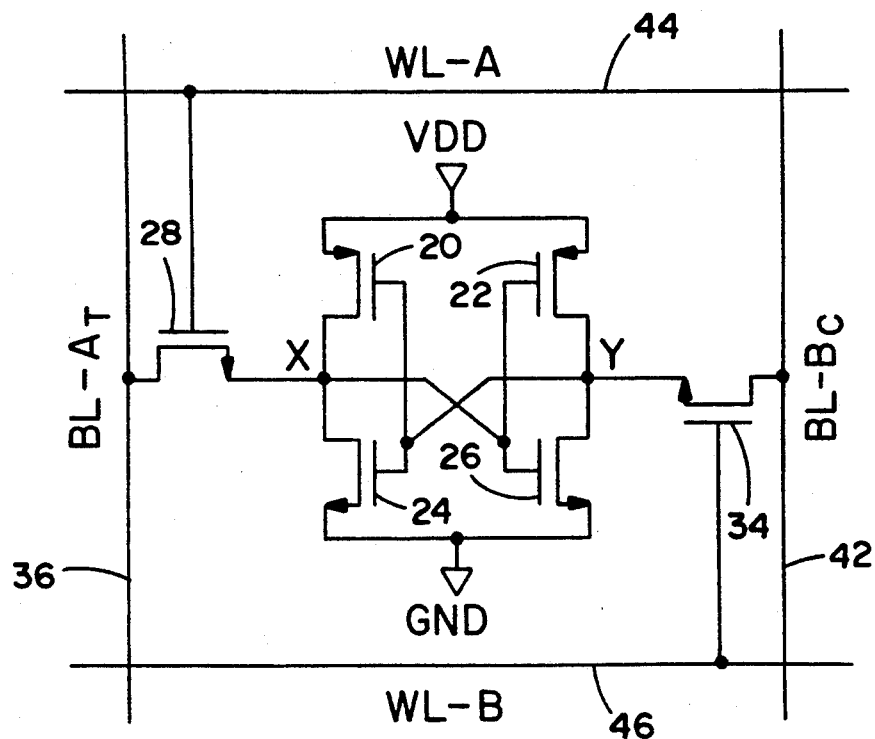
FIG. 3 is a prior art dual port SRAM circuit which exhibits a modest device count but does not operate satisfactorily under certain drive states.
Figure 4:
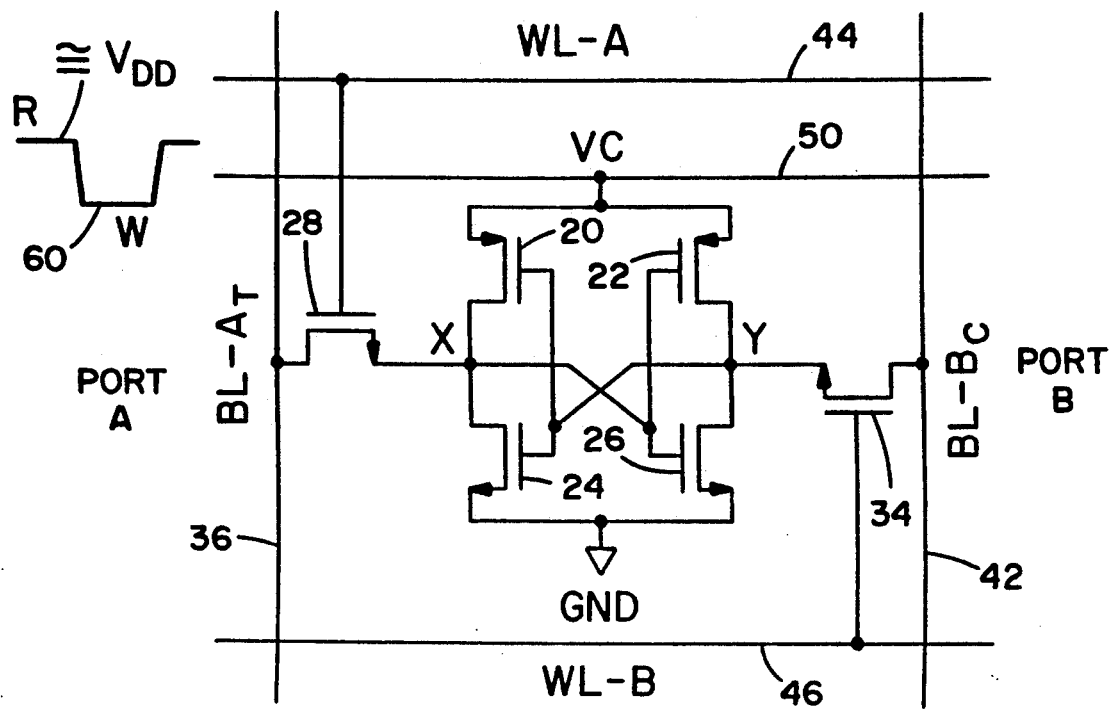
FIG. 4 is a modification to the circuit of FIG. 3 in accordance with the invention hereof, which enables satisfactory operation of the circuit under dual port conditions.

Referring now to FIG. 4, a SRAM memory cell is shown which utilizes single-ended bit line sensing/driving and achieves dual-port memory density comparable to single-port cell density. Structurally, the cell is identical to that shown in FIG. 3 (with identical components and levels lettered the same) except that the supply voltage VDD has been replaced with a two level supply that is applied to line 50 and provides levels R and W.

Figure 1:
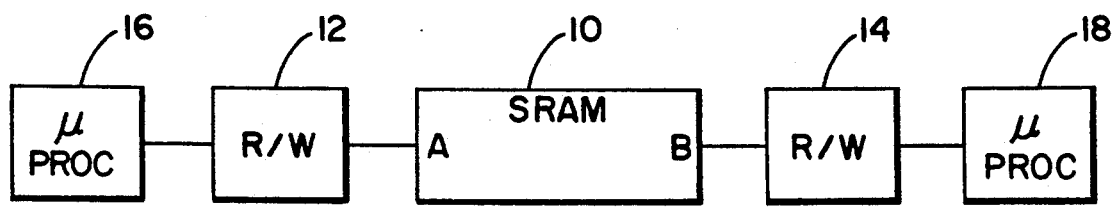
FIG. 1 is a block diagram of a prior art dual port SRAM.
Figure 5:
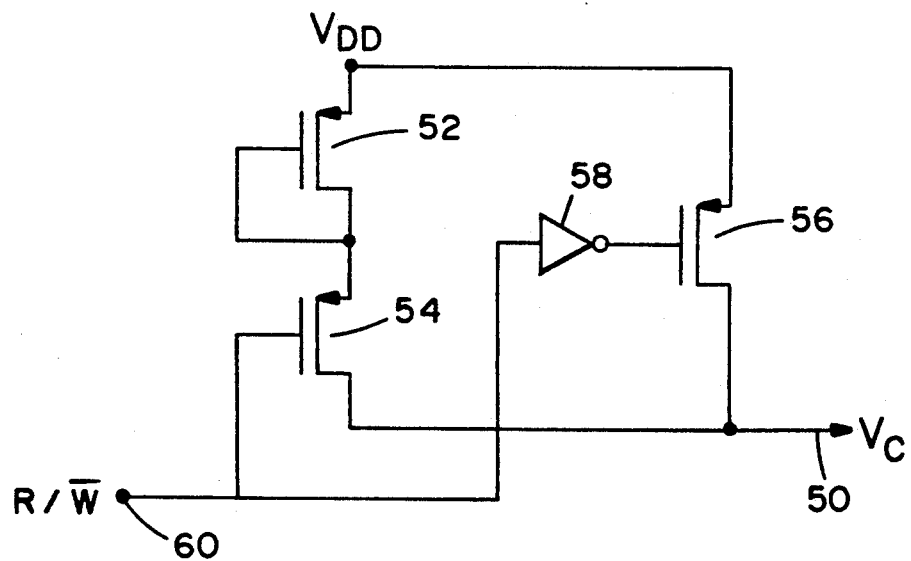
FIG. 5 is a circuit for providing dual level power supply voltages for SRAM read and write cycles.
Figure 2:
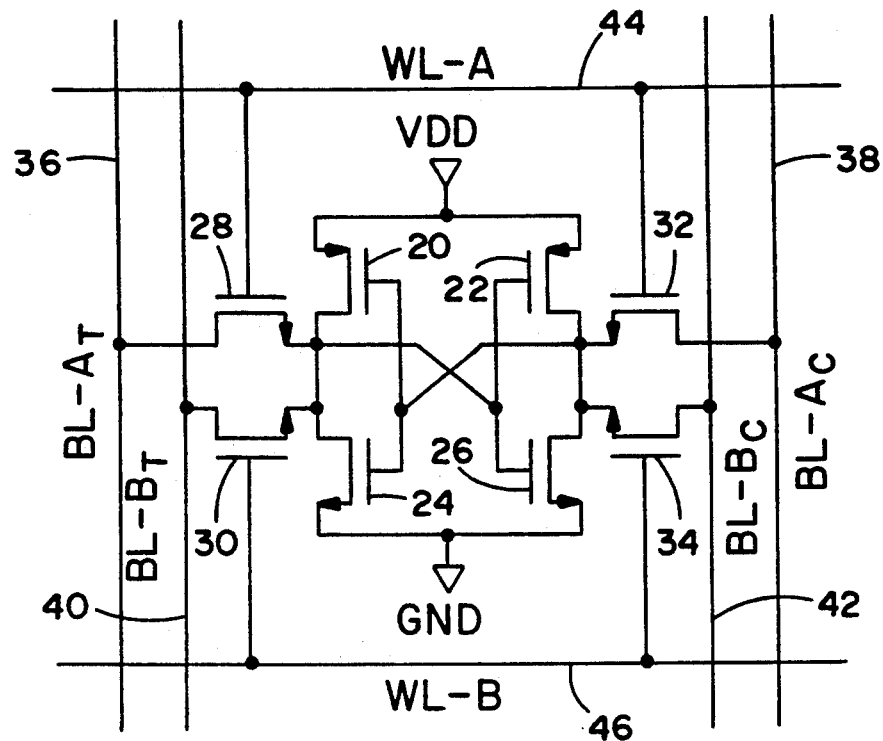
FIG. 2 is a circuit diagram of a prior art SRAM circuit employing differential driving and sensing.

An exemplary circuit for achieving the two level supply voltage VC is shown in FIG. 5 and comprises three p-channel transistors 52, 54 and 56 and an inverter 58, all coupled to a supply source. A control read/write signal VDD is applied via terminal 60 to the gate of transistor 54 and via inverter 58 to the gate of transistor 56. During a read cycle, the level at terminal 60 is maintained high so that transistor 54 is nonconductive, transistor 56 conductive and the voltage VC on line 50 is substantially at the VDD level. During a write cycle, the potential on terminal 60 is lowered, causing transistor 54 to conduct and transistor 56 to become nonconductive. As a result, the voltage drop that occurs across transistors 52 and 54 brings the VC potential on line 50 to an intermediate level that is shown in FIG. 4 as level 61.

The intermediate voltage level on line 50 is adjusted (e.g., by adjustment of the size of the conduction channel in transistor 52) to enable one port of the memory cell to be in the write mode and the other port in the read mode at the same time. If it is assumed that port B of the SRAM cell is in a read cycle while port A in a write cycle, it can be seen that the VC level on line 50 will affect not only the write action but the read action. If the VC potential is lowered for a proper write operation, it also reduces the cell current for read. If VC is brought too low, it may be insufficient to satisfy the necessary condition for a dual port cell that the output potential on the read side equal or exceed the logic state stored therein. As a result, the intermediate level of VC must be adjusted to prevent a decrease in potential that is excessive for port B (in this example). It has been found that if the intermediate level of VC is adjusted so that it is no less than one half of VDD, that the desired dual-port operation of cell can be maintained and the cell immunized from soft-errors.

Returning now to FIG. 4, the detailed operation of the memory cell will be described. During a read cycle, the VC level is maintained at a high level. If it is assumed that port A is to be read, word line 44 and bit line 36 are brought high, rendering transistor 28 conductive. The data level at node X is thereby reflected onto bit line 36 and sensed as the stored data level in the memory cell. At such time, B port word line 46 is maintained in the low state and transistor 34 is nonconductive. Should it be desired to read out both X and Y nodes simultaneously, both word lines 44 and 46 are brought high as well as are bit lines 36 and 42.

Assume now that node X is at the low or zero state and that it is desired to write a one through port A. When node X is at the zero state, transistor 24 is conductive and transistor 20 non-conductive, while transistor 22 is conductive and transistor 26 is non-conductive. Prior to the write action, the VC potential on line 50 is reduced to intermediate level 60. As a result, that level is reflected through conductive transistor 22 to node Y and to the gate of transistor 24. Transistor 24 is thus rendered less conductive. When word line 44 and bit line 36 are raised and transistor 28 becomes conductive, the high potential on bit line 36 appears across a voltage divider comprising transistors 28 and 24. Due to the lower conduction state of transistor 24, the voltage level at node X is raised. That action causes transistor 26 to become heavily conductive and further drops the potential at node Y to cause transistor 24 to go into nonconduction. As a result, a one is written into the cell and node X exhibits the high state.

By assuring that level 61 is not less than one half of VDD, the potential at node Y, during a write action does not fall below the minimum level required for a sensible logical output. As will be recalled, transistor 26 is nonconductive and indicates a one state at node Y.

If there is a read access via port B to the memory cell during the time that the intermediate level 60 of VC is applied to line 50, node Y will still reflect the proper logical level through transistor 34 onto bit line 42. It can be seen that asynchronous read/write operation is thus enabled, while still allowing a single-ended write operation to the cell.

Figure 6:
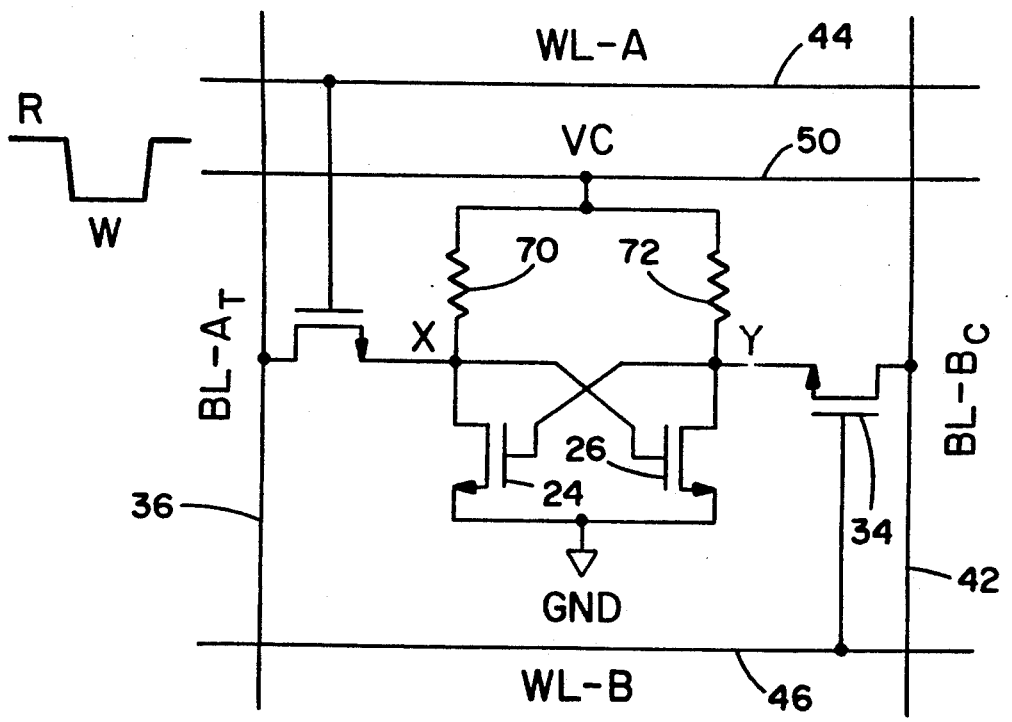
FIG. 6 is a further embodiment of the circuit of FIG. 4.

Referring now to FIG. 6, a modification to the circuit of FIG. 4 is shown wherein the transistors 20 and 22 have been replaced with resistances 70 and 72. The operation of the cell of FIG. 6 is substantially identical to that of FIG. 4 and all like components and levels are identically identified.

While the invention has been particularly shown and described with respect to a preferred embodiment thereof, it will be understood by those skilled in the art that changes in form and details may be made therein without departing from the scope and spirit of the invention.

What is claimed is:

1. A dual port, static, random access memory cell comprising:

first and second word lines and first and second bit lines;

a pair of semiconductor memory devices, each having a first electrode and a control electrode cross connected to a first electrode of another one of said pair to create a bistable circuit for storing true and complement logic levels, said semiconductor memory devices coupled between a common potential and a power supply line connected to a power supply that provides at least a first voltage level;

a first access semiconductor connected between said first bit line and one of said semiconductor memory devices, said first access semiconductor having a control electrode connected to said first word line;

a second access semiconductor connected between said second bit line and another of said semiconductor memory devices, said second access semiconductor having a control electrode connected to said second word line;

first read/write means coupled to said first bit and word lines for applying write potentials to said first bit and word lines to switch the conduction states of said semiconductor memory devices; and means connected to said power supply for applying a second voltage level that is reduced in voltage level relative to said first voltage level on said power supply line when said first read/write means applies said write potentials, said second voltage level being at least 50% of said first voltage level, whereby a logic level at said second access semiconductor continues to exhibit a voltage level consistent with a predetermined logic state at said second access semiconductor.

2. The memory cell of claim 1, wherein second read/write means are coupled to said second word and bit lines, said first read/write means and second read/write means independently operable to access said memory cell.

3. The memory cell of claim 2 wherein said semiconductor memory devices are a pair of field effect transistors each including a first electrode and a control electrode, and wherein when one said field effect transistor is in a heavily conducting state, a first electrode of said one field effect transistor reflects a complement logic level and the other field effect transistor is nonconductive, and a first electrode of said other field effect transistor reflects a true logic level, the reduction of voltage level on said power supply line reduces the conducting state of said one field effect transistor to thereby increase a potential on said first electrode of said one field effect transistor and thus the potential to the connected control electrode on said other field effect transistor, said reduced voltage level, as applied to said other field effect transistor, enabling said other field effect transistor to maintain an output level within a true logic state.

4. The memory cell of claim 3 wherein said first and second access semiconductors are FETs having gate electrodes respectively connected to corresponding word lines and conduction electrodes respectively connected to corresponding bit lines.

5. The memory cell of claim 4 wherein each of said crosscoupled FETS exhibit same conduction types and are serially connected to said power supply line by opposite conduction type field effect transistor each having control electrodes, said control electrodes of each said serially connected opposite conduction type field effect transistor being commonly connected to a control electrode of the field effect transistor serially connected thereto.

6. The memory cell of claim 4 wherein each of said crosscoupled field effect transistors are of the same conduction type and are respectively serially connected to said power supply line by serially connected impedances.

* * * * *